United States Patent [19]

Park

[11] Patent Number: 5,166,540

[45] Date of Patent: Nov. 24, 1992

[54] STEPPED SIGNAL GENERATING CIRCUIT

[75] Inventor: Jong-suk Park, Buchon, Rep. of Korea

[73] Assignee: Goldstar Electron Co., Ltd., Cheongju, Rep. of Korea

[21] Appl. No.: 626,208

[22] Filed: Dec. 12, 1990

[30] Foreign Application Priority Data

Mar. 10, 1990 [KR] Rep. of Korea ............... 90-3214

[51] Int. Cl.⁵ .......... H03K 4/02; H03K 5/00; H03K 5/08; G06G 7/12
[52] U.S. Cl. .................. 307/227; 307/490; 307/497; 307/241; 307/261; 328/36; 328/156; 328/186; 323/315
[58] Field of Search .............. 307/227, 490, 497, 364, 307/241, 242, 243, 261; 328/186, 154, 156; 330/257; 323/315

[56] References Cited

U.S. PATENT DOCUMENTS 3,571,577  3/1971  Kubo ............................ 377/40
4,473,802  9/1984  Min et al. ..................... 330/278
4,883,988 11/1989  Ide et al. ..................... 330/257

Primary Examiner—Janice A. Howell
Assistant Examiner—Trong Quang Phan
Attorney, Agent, or Firm—Blakely, Sokoloff, Taylor & Zafman

[57] ABSTRACT

The present invention discloses a stepped signal generating circuit for producing stepped signals having nearly perfect sinusoidal stepped signals. The stepped signal generating circuit comprises a plurality of current mirror switching sections, each having a P type and an N type current mirror for outputting constant currents upon receiving digital signals. N-MOS transistors are provided to pass or block the output current of each switching section. The constant currents outputted from the switching sections are then controlled by a constant voltage of the constant voltage source. The final output is controlled by a constant current of a constant current source before being outputted. Accordingly, the present invention generates precise and nearly sinusoidal stepped signals.

4 Claims, 9 Drawing Sheets

STEPPED SIGNAL GENERATING CIRCUIT

FIELD OF THE INVENTION

The present invention relates to a stepped signal generating circuit, and particularly to a stepped signal generating circuit in which sinusoidal stepped signals can be formed by adjusting the size ratio of the transistors of a current mirror.

BACKGROUND OF THE INVENTION

As shown in FIG. 1, the conventional stepped signal generating circuit is constituted such that the connection points of serially connected resistances 101-106 are connected to one sides of N-MOS transistors 107-111 which receive digital input clocks 1-5 through their gates, and the other sides of the N-MOS transistors 107-111 are commonly connected to an output terminal 112. In the conventional circuit constituted as described above, the digital clocks 1-5 are digital signals which are outputted sequentially at the same intervals as the input clocks after receipt of digital input clocks of a certain frequency, as shown in FIG. 2A.

The digital clocks 1-5 shown in FIG. 2A are supplied to the gates of the N-MOS transistors 107-111 in order to turn-on/off the N-MOS transistors 107-111. In such a manner that the N-MOS transistors receiving high level digital clocks should be turned on, and that the levels of the output voltages should be varied as shown in FIG. 2B, thereby forming stepped type output voltages. That is, the digital clocks 1-5 in the form of 10000, 01000, 00100, 00010, and 00001 are inputted into the gates of the N-MOS transistors 107-111, with the result that stepped signals are outputted through the output terminal 112.

However, in the conventional stepped signal generating circuit, the power source $V_{DD}$ is supplied thoroughly the resistances 101-106, and therefore, when the resistance values of the resistances 101-106 are processed. It is difficult to define the resistance values. Not only so, but it is also difficult to design the sizes of the transistors 107-111 in a uniform manner, and therefore, if there is a signal which is delivered to the control gates even slightly late, then an abnormality is generated in the output, thereby making it impossible to form perfect stepped signals.

SUMMARY OF THE INVENTION

The present invention is intended to overcome the above described disadvantages of the conventional circuit. Therefore, it is the object of the present invention to provide a stepped signal generating circuit in which perfect stepped signals can be produced by varying the output current of the current mirror by means of digital signals, and which is also applicable to a digital/analog converter because the circuit of the present invention is capable of forming stepped signals close to the sinusoidal signals.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

Figure 1:
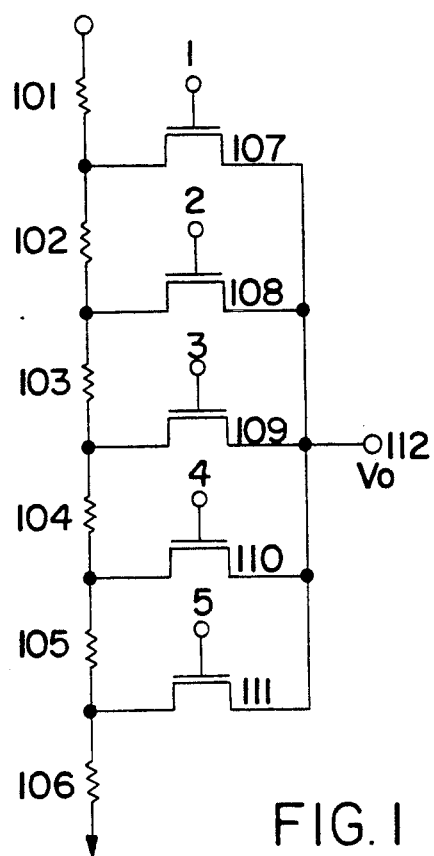
FIG. 1 is a circuital illustration of the conventional stepped signal generating circuit.
Figure 2:
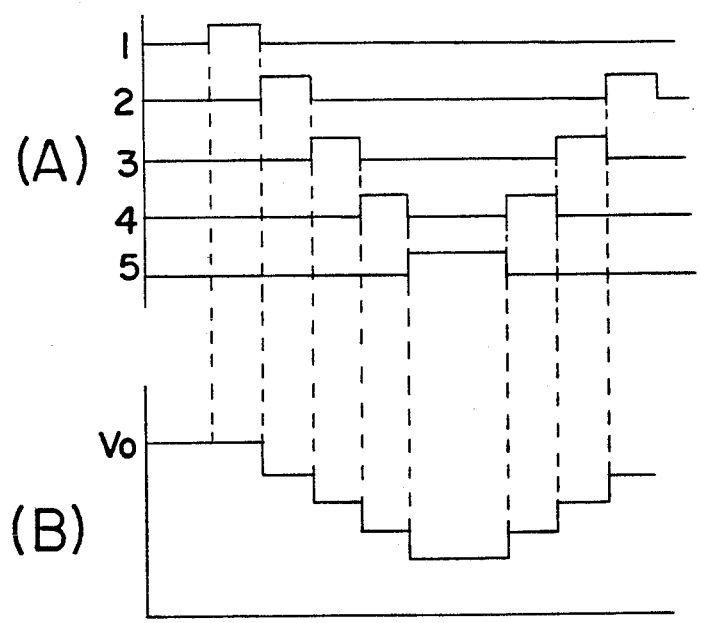
FIGS. 2(A)-2(B) illustrate the waveforms of the output voltage which are generated after receipt of digital input clocks according to the conventional circuit.
Figure 3A:
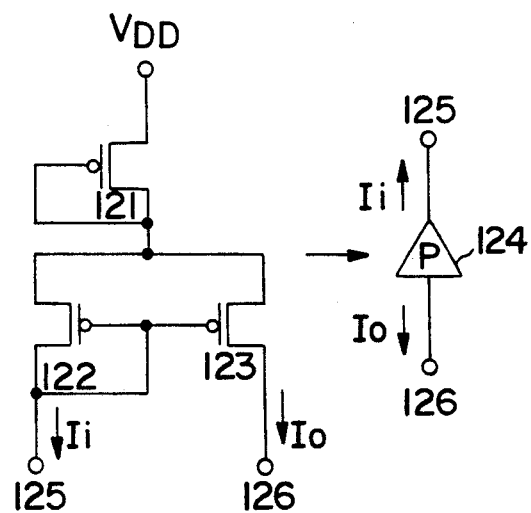
FIG. 3A is a circuital illustration of a P type current mirror according to the present invention.
Figure 3B:
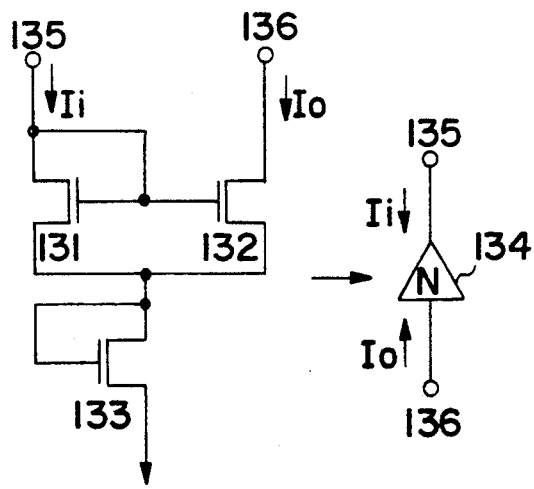
FIG. 3B is a circuital illustration of an N type current mirror according to the present invention.

FIG. 3A illustrates a P type current mirror 124 which consists of P-MOS transistor 121-123, while FIG. 3B illustrates an N type current mirror 134 which consists of N-MOS transistors 131-133. As the current mirror 124 of FIG. 3A is a P type, it receives only a digital signal "0" or "1" through its input terminal 125. Here, if the input is "1", there flows no current through its output terminal 126, while, if the input is "0", then a current Io flows through the output terminal 126.

As the current mirror 134 of FIG. 3B is an N type, it receives only a digital signal "0" or "1". If the input is "0", there flows no current through its output terminal 136, while if the input is "1", a current Io flows through the output terminal 136.

Figure 4:
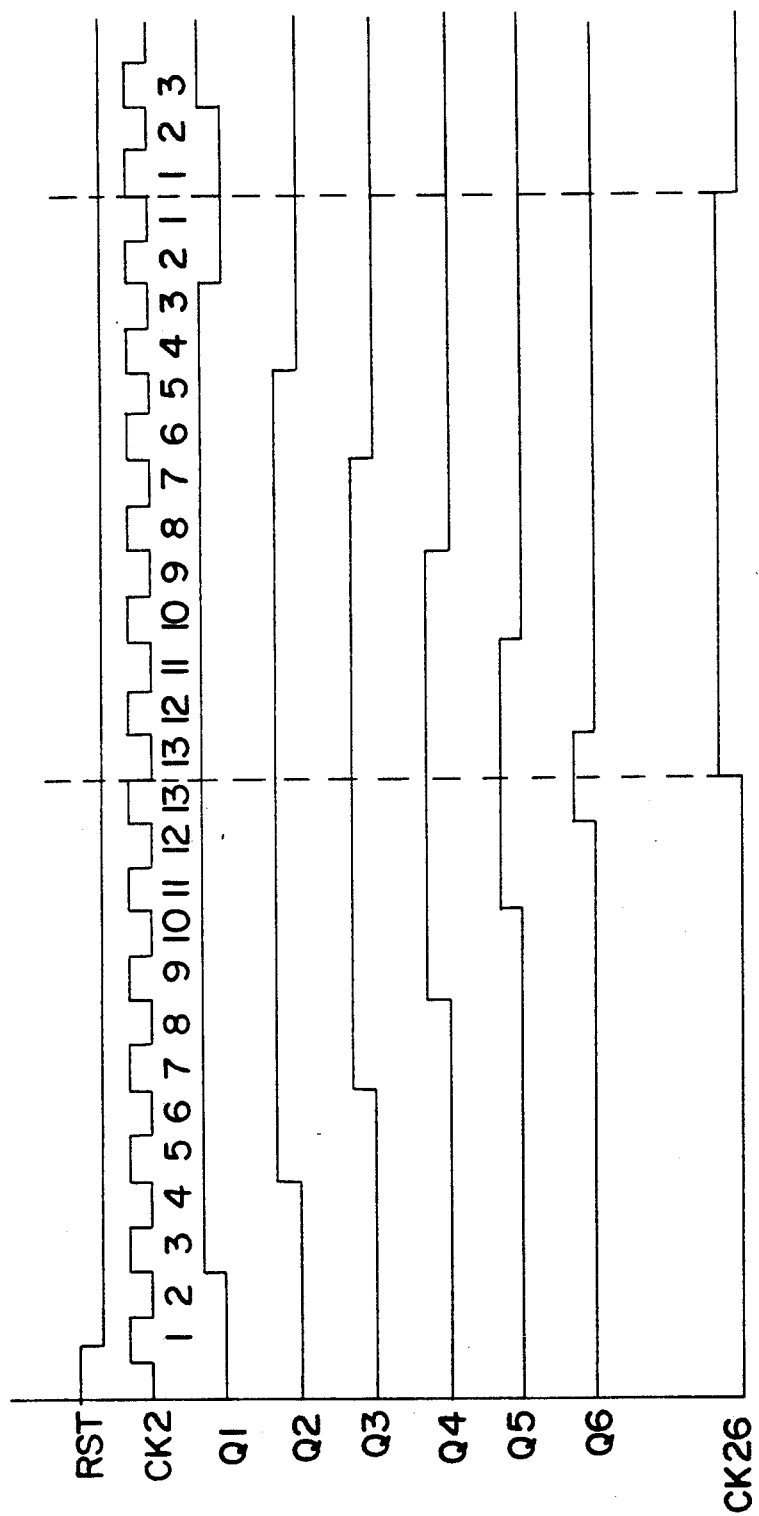
FIG. 4 shows the wave forms of the digital input signals according to the present invention.
Figure 5:
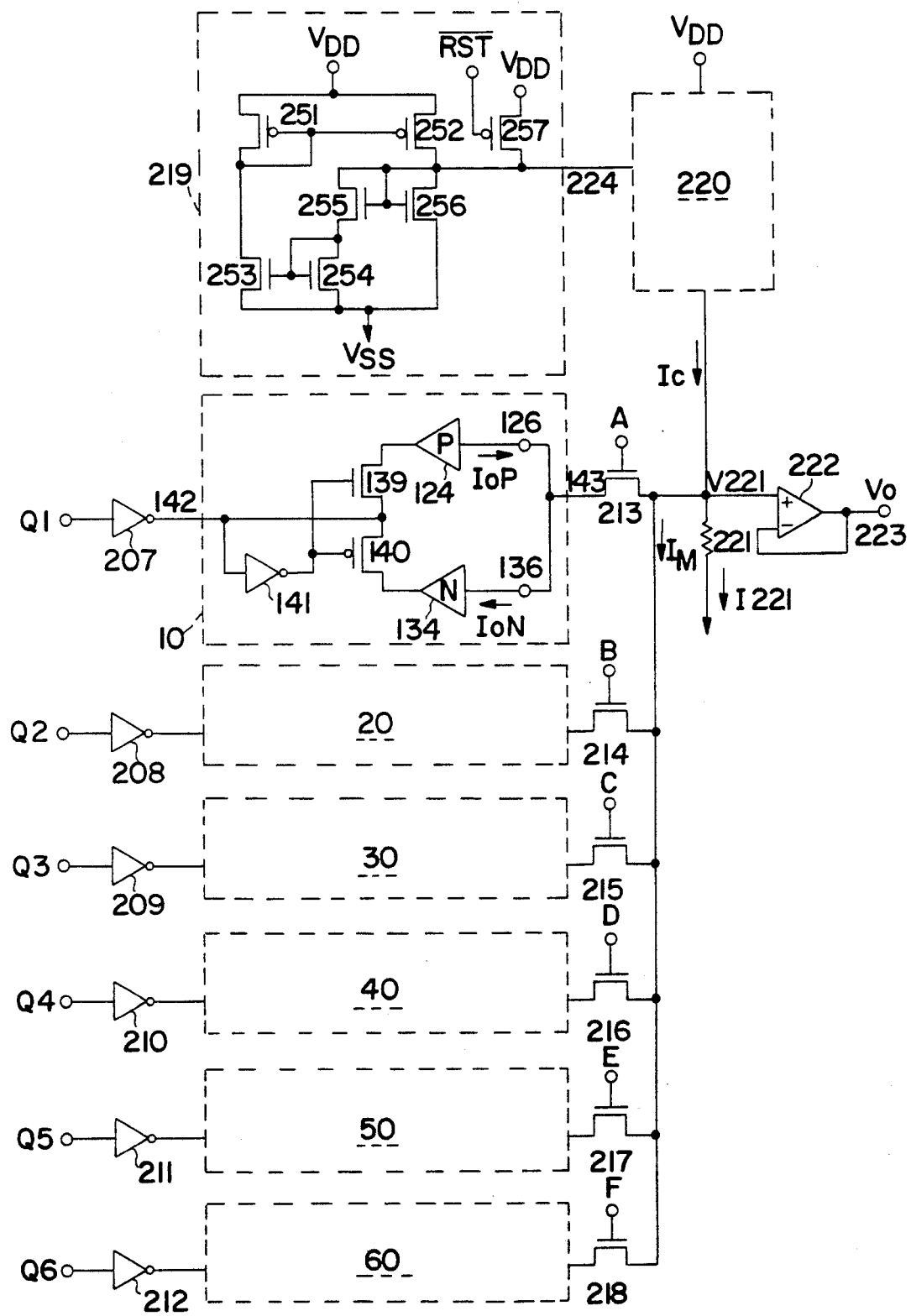
FIG. 5 is a circuital illustration of the stepped signal generating circuit according to the present invention.

FIG. 4 illustrates the waveforms of the digital clock signals which are inputted into the circuit of the present invention, and FIG. 5 is a circuital illustration of the stepped signal generating circuit according to the present invention.

Digital clock signals Q1-Q6 which are illustrated in FIG. 4 are supplied through inverters 207-212 to current mirror switching sections 10-60 which are constituted all in the same form. The outputs which are switched over by the current mirror switching sections 10-60 pas through the N-MOS transistors 213-218 which receive the control signals A-F through their gates. Then the outputs are commonly connected, and are inputted into both a resistance 221 and the positive terminal of a buffer 222 together with the current from a constant current source 220, while an output terminal 223 is connected to the negative terminal of the buffer 222. The voltage 224 of a constant voltage source 219 is connected to the constant current source 220 to which the power source $V_{DD}$ is supplied.

Now the constitutions of the current mirror switching sections 10-60 will be described in detail. Each of the current mirror switching sections 10-60 comprises a P type current mirror 124 and an N type mirror 134 interconnected through an inverter 141. That is, an input line 142 is connected to both a P-MOS transistor 140 and an N-MOS transistor 139, and is also connected through an inverter 141 to the gates of the N-MOS transistor 139 and the P-MOS transistor 140. The N-MOS transistor 139 is connected the P type current mirror 124, and the P-MOS transistor 140 is connected to the N type current mirror 134, while the output terminals of the P type current mirror 124 and the N-type current mirror 134 are connected through a common terminal to an output terminal 143.

The current mirror switching sections 10-60 constituted as above will now be described as to its operations.

If the input 142 is "1", it is shifted to "0" during the passage through the inverter 141 before it is inputted into the gates of the N-MOS transistor 139 and the P-MOS transistor 140.

Accordingly, the P-MOS transistor 140 is turned on, and the N-MOS transistor is turned off, so as for the N-type current mirror 134 to be activated. Accordingly, an amount of current as much as the current Io passes through the output terminal 143.

Meanwhile, if the input is "0", it is converted to "1" during the passage through the inverter 141, before it is inputted into the gates of the N-MOS transistor 139 and the P-MOS transistor 140. Accordingly, the N-MOS transistor 139 is turned on, and the P-MOS transistor 140 is turned off, with the result that the P type current mirror 124 is activated, and that an amount of current as much as the current Io flows through the output terminal 143.

Now the constitution of the constant voltage source circuit 219 will be described in detail.

A power source $V_{DD}$ is connected to P-MOS transistors 251, 252, the gates of which are connected to each other, while the connection point of the gates to the P-MOS transistors 251, 252 is connected to the connection point of the P-MOS transistor 251 and the N-MOS transistor 253. Meanwhile, the gate of the N-MOS transistor 253 is connected to the gate of an N-MOS transistor 254, and to the connection point between the N-MOS transistors 254, 255. The gates of the N-MOS transistors 255, 256 are connected together and also are connected to the N-MOS transistor 255, the connection point between the P-MOS transistor 252 and the N-MOS transistor 256, the output terminal 224, and a P-MOS transistor 257, the gate of which receives an inverted signal $\overline{RST}$ which is inverted from a reset signal RST.

The constant voltage source circuit 219 constituted as above will now be described as to its operations.

Figure 6:
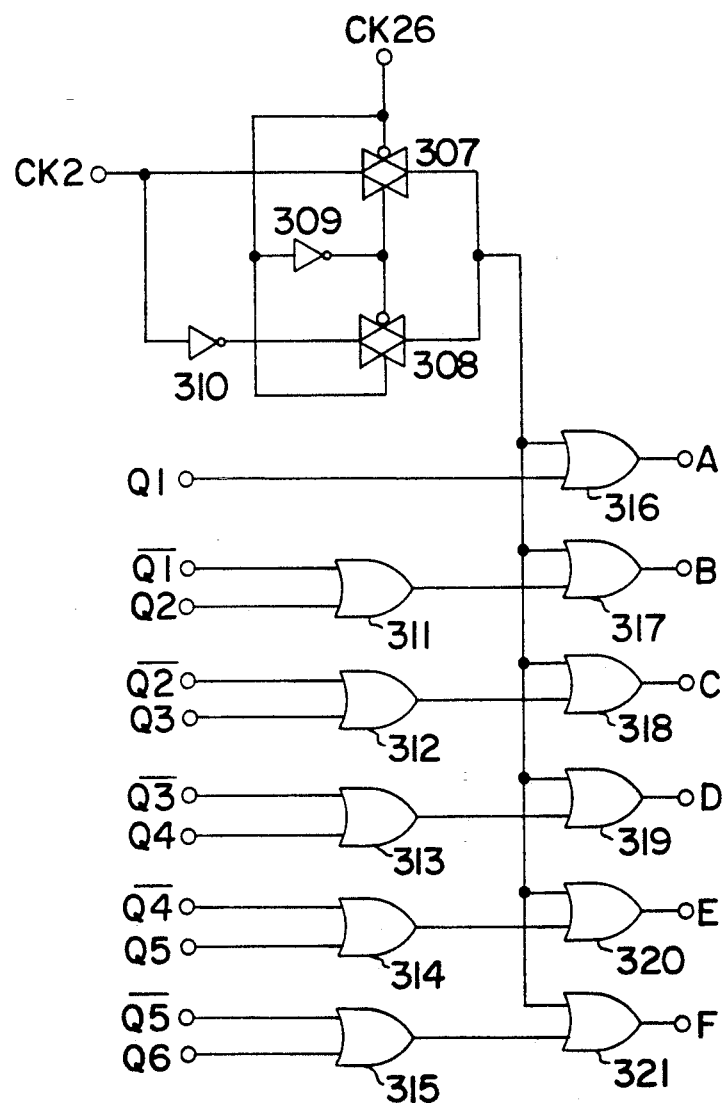
FIG. 6 is a circuital illustration of the control signal generating circuit for the circuit of FIG. 5.

During the reset period, the output terminal 224 receives, the power source $V_{DD}$, while, after the release of the reset, the output terminal 224 receives another constant voltage. The control signal generating circuit for generating the control signals A-F as shown in FIG. 5 is illustrated in more detail in the FIG. 6. That is, transfer gates 307, 308 are selected by a clock signal CK26 of FIG. 4 so as for a clock signal CK2 to be selectively outputted. This clock signal CK2 is supplied to the input sides of OR gates 316-321, while the other input terminal of the OR gate 316 receives a digital signal Q1 of FIG. 4. The other input terminals of OR gates 317-321 receive the outputs of OR gates 311-315, while the input sides of the OR gates 311-315 respectively receive digital signals Q2-Q6 of FIG. 4. The other input terminals of the OR gates 311-315 respectively receive inverted signals Q1-Q5 which are inverted from the digital signals Q1-Q5, while the output terminals of the OR gates 316-321 respectively output the control signals A-F.

The output signals A-F play the role of controlling the N-MOS transistors 213-218 according to the present invention as shown in FIG. 5. If the clock signal CK26 is "0", the output signals A-F are decided by the combination of the digital signals Q1-Q6 and the clock signal CK2 of FIG. 4, in such a manner that the turning-on/off of the N-MOS transistors of FIG. 5 should be decided by it.

Meanwhile, if the clock signal CK2 is "1", the output signals A-F are decided by the combination of the digital signals Q1-Q6 and the inverted signal of the clock signal CK2, in such a manner that the turning-on/off of the N-MOS transistors 213-218 of FIG. 5 should be decided by it.

Now the operations of the stepped signal generating circuit according to the present invention as illustrated in FIG. 5 will be described based on the above descriptions.

During a reset, the constant voltage 224 which is outputted form the constant voltage source 219 becomes a power source $V_{DD}$, and no constant current IC flow from the constant current source 220. If the reset state is released, the constant voltage 224 reaches a certain level, and owing to this voltage, a constant current Ic flows from the constant current source 220. Under this condition, owing to the digital input clocks Q1-Q6 and the control signals A-F, the current $I_M$ (the current flowing through the output terminals of the N-MOS transistors 213-218) is varied to between $-6|I_{ON}|-6|I_{ON}|$ (or to $-6|I_{op}|-6|I_{op}|$, where $|I_{op}|-|I_{ON}|$).

Figure 7:
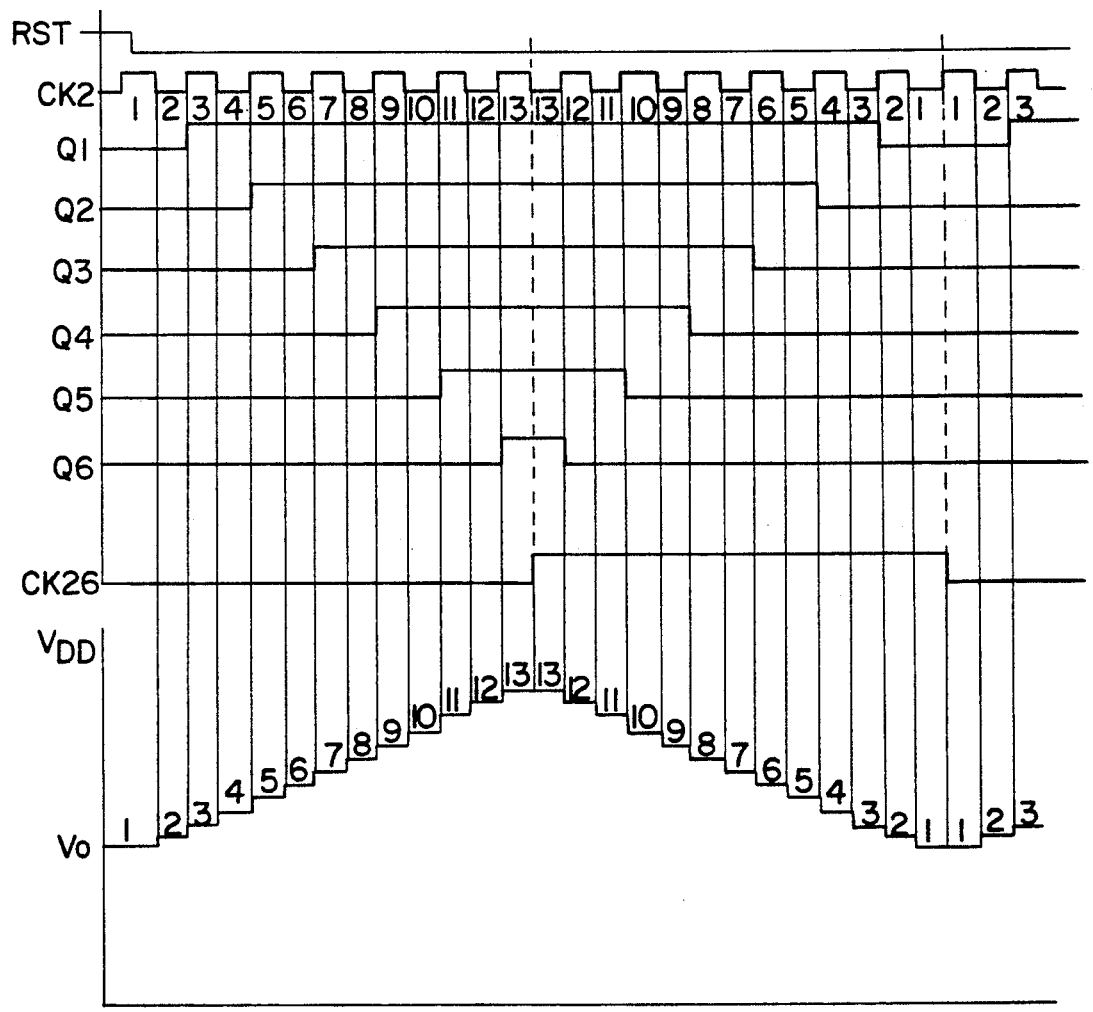
FIG. 7 illustrates the waveforms of the output voltages which are generated after receipt of digital input signals to the circuit of FIG. 5.

The level of the voltage V221 (the voltage of the positive terminal of the buffer 222) is varied in accordance with the amount of the current I221 flowing through the resistance 221, if the sizes of the constant current source transistor and the transistors for the N type and P type current mirrors 134, 124 of the current mirror switching section 10-60 are adjusted in such a manner that the current Ic of the constant current source should be larger than $I_M$max, that is, in such a manner that the relationship $Ic > I_M$ max should be established. The voltage V221 is outputted through the buffer 222 to the output terminal 223, resulting in that the voltage Vo appears, this voltage Vo rising or falling in a stepped form as shown in FIG. 7.

The adjustment of the rising voltage Vo is done by adjusting sizes of the transistors for the N type and P type current mirrors shown in FIGS. 3A and 3B. FIG. 7 is a timing chart showing the relationship between the digital input clock and the stepped signal output Vo of the present invention, in a state with the sizes of the transistors for the P type and N type current mirrors made equal to each other.

Figure 8:
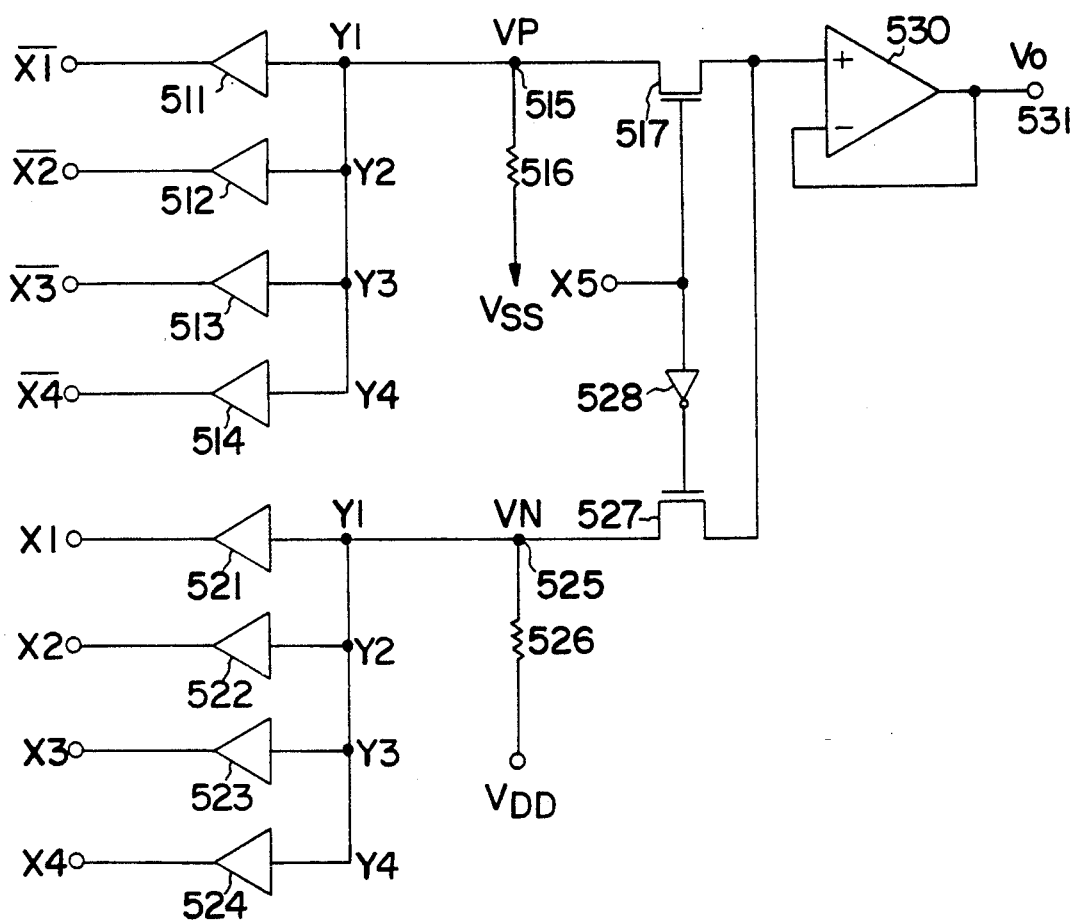
FIG. 8 illustrates another embodiment of the stepped signal generating circuit according to the present invention.

FIG. 8 illustrates another embodiment of the stepped signal generating circuit according to the present invention, and this circuit is described below.

Figure 9:
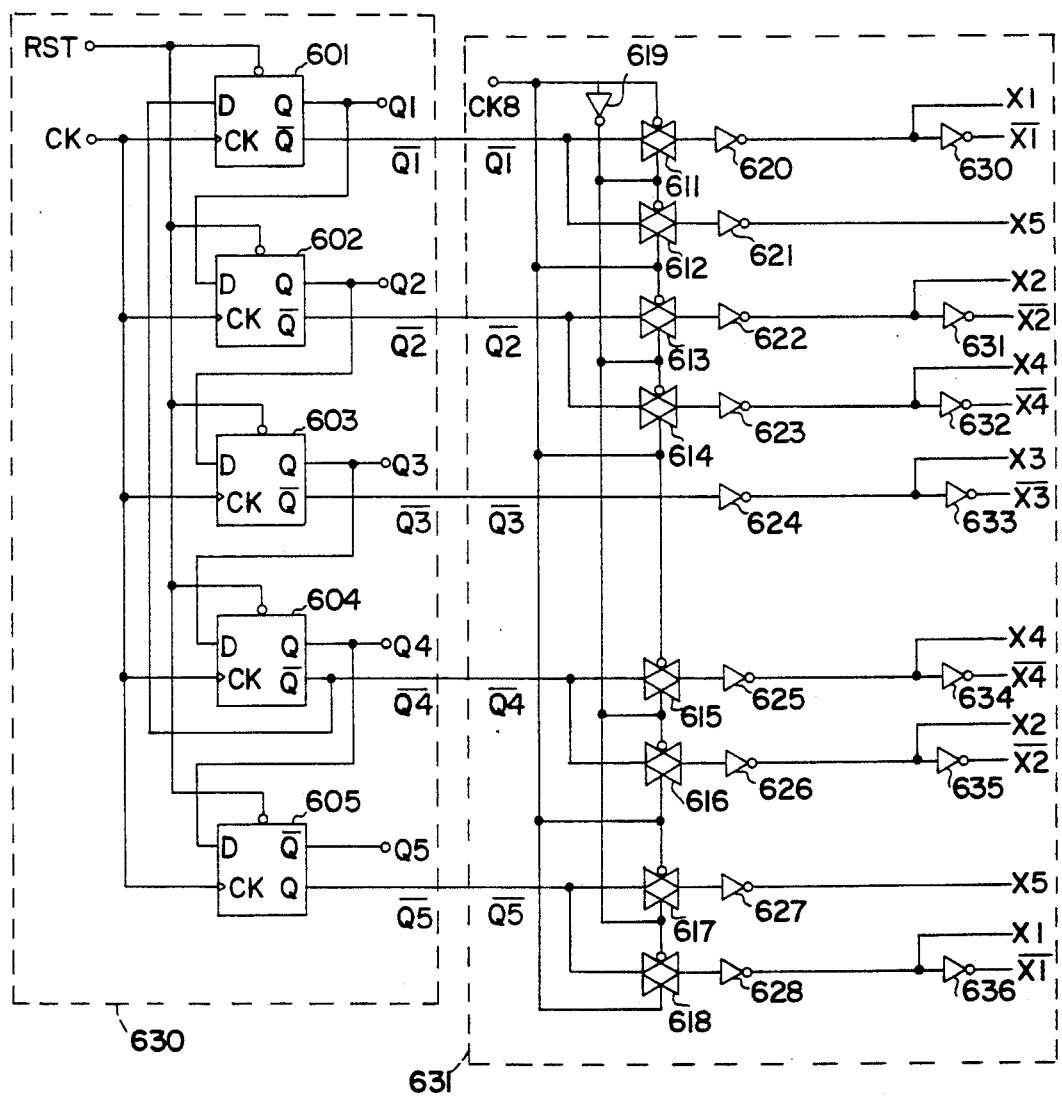
FIG. 9 is a circuital illustration of the input data generating circuit for the circuit of FIG. 8.
Figure 10:
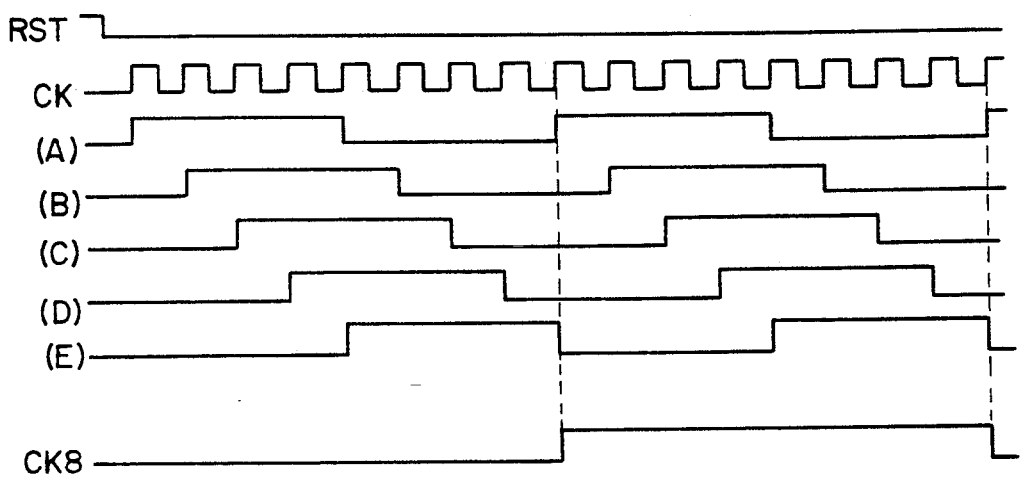
FIG. 10 illustrates the waveforms of the outputs of the counter section of FIG. 9.
Figure 11:
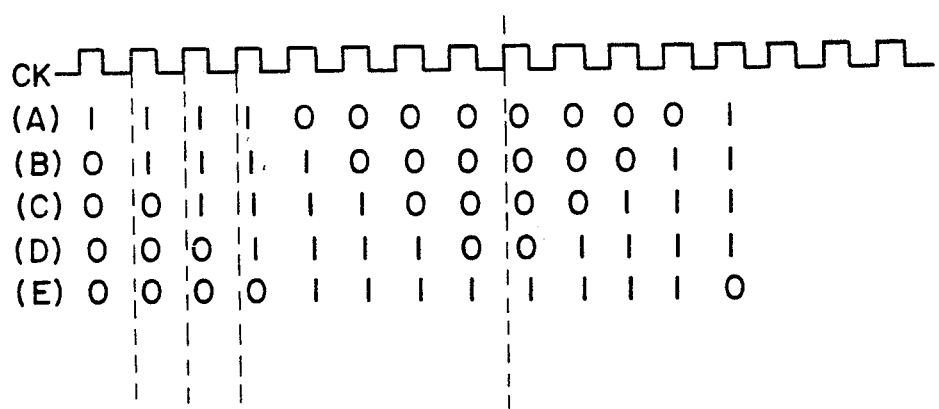
FIG. 11 illustrates the waveforms of the outputs of the circuit of FIG. 9.

P type mirrors 511-514 are let to receive respectively data $\overline{X1}$-$\overline{X4}$ which are inverted out from output data X1-X4 of the input data generating a circuit of FIG. 9, and the output terminals of the P type mirrors 511-514 are connected together to a common terminal. Then the common connection point 515 is connected to a resistance 516 on the one hand, and also connected through an N-MOS transistor 517 to the input terminal of a buffer 530 on the other hand.

N type mirrors 521-524 are let to receive output data X1-X4 which are generated from the input data generating circuit of FIG. 9, and the output terminals of the N type mirrors 521-524 are commonly connected to a terminal. The common connection point 525 for the output terminals is connected to a resistance 526 on the one hand, and also connected through an N-MOS transistor 527 to the input terminal of the buffer 530 on the other hand. Further, the output data X5 of FIG. 9 is let to be supplied directly to the gate of the N-MOS transistor 517, and the output data X5 is also let to be supplied through an inverter 528 to the gate of the N-MOS transistor 527, while the output of the buffer 530 is let to be supplied to an output terminal 531 of the buffer 530.

The circuit of FIG. 9 comprises a counter section 630 with D type flip-flops 601-605 connected thereto; and a data selecting section 631 for generating the input data for the stepped signal generating circuit after receipt of output data $\overline{Q1}$-$\overline{Q5}$ from the counter section 630. Here, the waveforms of the output data $\overline{Q1}$-$\overline{Q5}$ of the counter section 630 are shown in FIGS. 10A to 10E, and the output data $\overline{Q1}$-$\overline{Q5}$ of the counter section 630 are used as the input data for the data selecting section 631. Here, the data selecting section 631 is operated in such a manner that, by the controlling function of a clock signal CK8, input data X1-X5, X1-X4 for the stepped signal generating circuit must be outputted through inverters 620-628 and inverters 630-636, respectively.

That is, of the data $\overline{Q1}$-$\overline{Q5}$ outputted from the serially connected flip-flops 601-605, the output data $\overline{Q3}$ is directly outputted as an output data through the inverter 624, while the remaining ones are outputted respectively through transfer gates 611-618, the gages of which receive 8-frequency-divided clock pulses CK8.

The above described circuit is operated in a manner described below.

First, the input data generating circuit of FIG. 9 selects and outputs the input data for the stepped signal generating circuit because the transfer gates 611-618 are controlled by the 8-frequency-divided clock signal CK8. That is, when the clock signal CK8 is "0", the output X1 is an inverted output data of $\overline{Q1}$, X2 is an inverted output data of $\overline{Q2}$, X3 is an output data of Q3, X4 is an inverted output data of $\overline{Q4}$, and X5 is an inverted output data of $\overline{Q5}$, while, when the clock signal CK8 is "1", the output X1 is an inverted output data of $\overline{Q5}$, X2 is an inverted output data of $\overline{Q4}$, X3 is an inverted output data of $\overline{Q1}$, these being illustrated in Q2, and X5 is an inverted output data of $\overline{Q1}$, these being illustrated in FIGS. 11A to 11E. On the other hand, when the clock signal CK8 is "0", the output data X1 is a data $\overline{Q1}$ outputted from said counter section 630, X2 is a data $\overline{Q2}$, X3 is a data $\overline{Q3}$, X4 is a data $\overline{Q4}$, when the clock signal CK8 is a "1", the output data X1 is a data $\overline{Q5}$ outputted from said counter section 630, X2 is a data $\overline{Q4}$, X3 is a data $\overline{Q3}$, X4 is a data $\overline{Q2}$. The data X1-X4 which are outputted in the above described manner are supplied through the N type current mirrors 521-524 to the drain of the N-MOS transistor 527, and after being converted to the inverted data $\overline{X1}$-$\overline{X4}$ by inverters 630-636, they are supplied through the P type current mirrors 511-514 to the drain of the N-MOS transistor 517 as shown in FIG. 8.

Accordingly, during the first four stages in which the input data X5 is "0", the N-MOS transistors 517,527 are respectively turned off and turned on, and therefore, the output currents of the N type current mirrors 521-524 are controlled owing to the conversions of the input data X1-X4, with the result that the potential VN at the connection point 525 is shifted.

Figure 12:
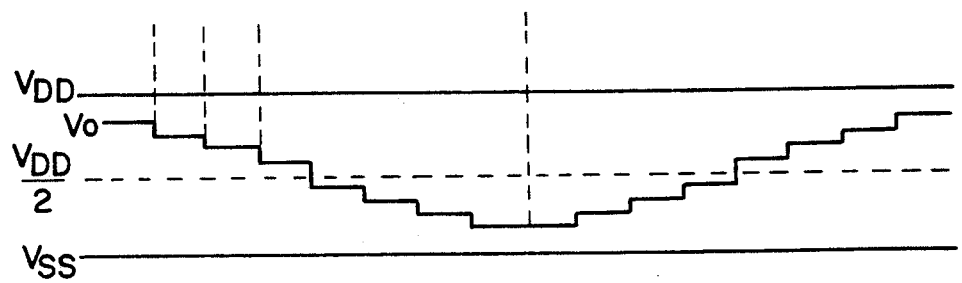
FIG. 12 illustrates the waveforms of the outputs of the circuit of FIG. 8.

On the other hand, during the period when the input data X5 is "1", the N-MOS transistors 517,527 are respectively turned on and turned off, and accordingly the output currents of the P type current mirrors 511-514 are controlled owing to the conversions of the input data $\overline{X1}$-$\overline{X4}$, with the result that the potential Vp of the connection point 515 is shifted. In this way, if the input data X5 is "0", the shifted potential VN of the connection point 525 is outputted through the buffer 530, while, if the input data X5 is "1", the shifted potential VP of the connection point 515 is outputted through the buffer 530, thereby making it possible to obtain the stepped signals shown in FIG. 12.

Thus, according to the present invention, precise stepped signals can be formed by varying the output currents of the current mirrors by means of digital signals, and particularly, almost sinusoidal stepped waves can be formed, thereby making it possible to apply the circuit of the present invention even to a digital/analog converter.

What is claimed is:

1. A stepped signal generating circuit comprising:
   current mirror switching sections 10-60 respectively including a P-type current mirror and an N-type current mirror for outputting constant currents after receipt of digital signals;
   N-MOS transistors 213-218 for passing or blocking the constant currents outputted from said current mirror switching sections 10-60;
   a constant current source 220 controlled by a constant voltage of a constant voltage source 219, and for outputting a constant current Ic;
   a resistor 221 for applying a voltage V221 adjusted by the currents from said N-MOS transistors 213-218 and said constant current Ic; and
   a buffer 222 connected to said N-MOS transistors 213-218, said constant current source 220 and said resistor 221, for receiving the voltage V221 and outputting stabilized stepped signals.

2. The stepped signal generating circuit as claimed in claim 1, wherein sinusoidal stepped waves can be obtained by adjusting the sizes of the transistors forming said P type and N type current mirrors.

3. A stepped signal generating circuit comprising:
   a counter section 630 including serially connected D type flip-flops 601-605, for outputting data $\overline{Q1}$-$\overline{Q5}$;
   a data selecting section 631 for outputting output data X1-X5, $\overline{X1}$-$\overline{X4}$ after the receipt of the data, said counter section 630 and said data selecting section 631 having an input data generating circuit for supplying the input data to the main circuit $\overline{O1}$-$\overline{O5}$;
   N-type current mirrors 521-524 with their potentials varied by said data X1-X4 outputted from said data selecting section 631;
   an N-MOS transistor 527 which is turned on during a half cycle of said data X5 outputted from said data selecting section 631;
   P-type current mirrors 511-514 with their potentials varied by said data $\overline{X1}$-$\overline{X4}$ outputted from said data selecting section 631;
   an N-MOS transistor 517 which is turned on during a half cycle of said data X5 outputted from said data selecting section 631;

a resistors 526 connected to said N-type currant mirrors 521–524, and a drain of said N-MOS transistor 527, for applying a drain voltage to said N-MOS transistor 527;

a resistor 516 connected to said P-type current mirrors 511–514, and a drain of said N-MOS transistor 517, for applying a drain voltage to said N-MOS transistor 517;

a buffer 530 for receiving data outputted from a selected one of said N-MOS transistor 527 and said P-MOS transistor 517 and outputting stabilized stepped wave signals;

wherein said counter 630 and said data selecting section 631 form an input data generating circuit for supplying the input data.

4. The stepped signal generating circuit as claimed in claim 3, wherein said data selecting section 631 comprises:

transfer gates 611–618 for receiving data Q1, Q2, Q3, Q4, Q5 from D-type flip-flops 601, 602, 604, 605 in said counter section 630;

inverters 620–623 and 625–628 for receiving said data Q1, Q2, Q4, Q5 outputted from said transfer gates 611–618 and said data Q3 from said D-type flip-flop 603, and outputting data X1–X4 to said N-type current mirrors and said N-MOS transistors under control of a clock signal CK8;

inverters 630–636 for inverting data X1, X2, X3, X4 outputted from said inverters 620, 622, 623, 624, 625, 626 and 628, and outputting data X1–X4 to said P-type current mirrors 511–514.

* * * * *